(12) United States Patent
Lenz et al.

(10) Patent No.: US 6,712,929 B1
(45) Date of Patent: Mar. 30, 2004

(54) DEFORMATION REDUCTION AT THE MAIN CHAMBER

(75) Inventors: Eric Lenz, Pleasanton, CA (US); Albert R. Ellingboe, Lucan (IE); Fangli Hao, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 164 days.

(21) Appl. No.: 09/634,806

(22) Filed: Aug. 8, 2000

(51) Int. Cl.[7] ............................. C23C 16/00; C23F 1/00
(52) U.S. Cl. ............................. 156/345.43; 156/345.47; 118/723 E; 118/723 R
(58) Field of Search ............... 118/723 E, 723 ER, 118/723 I, 723 IR, 723 AN, 723 MW, 723 ME, 723 MA, 723 MR, 723 R; 156/345.47, 345.43, 345.48, 345.49, 345.41, 345.42, 345.46

(56) References Cited

U.S. PATENT DOCUMENTS

| | | | | |
|---|---|---|---|---|
| 4,585,920 A | * | 4/1986 | Hoog et al. ............ | 156/345.47 |
| 5,685,949 A | * | 11/1997 | Yashima ................ | 134/1.1 |
| 5,722,668 A | * | 3/1998 | Rice et al. ............. | 277/650 |
| 5,997,649 A | * | 12/1999 | Hillman ................ | 118/715 |
| 6,199,505 B1 | * | 3/2001 | Sato et al. ............. | 118/723 E |
| 6,365,063 B2 | * | 4/2002 | Collins et al. .......... | 216/71 |
| 6,422,172 B1 | * | 7/2002 | Tanaka et al. .......... | 118/723 R |

* cited by examiner

Primary Examiner—Luz Alejandro-Mulero
(74) Attorney, Agent, or Firm—Beyer Weaver & Thomas, LLP

(57) ABSTRACT

A vacuum chamber with a cover with a first section, a second section, and a pocket between the first section and second section is provided. The vacuum chamber has a main cavity to which the first section is adjacent. The vacuum chamber may be used for plasma processing, which may require a critical element to be supported by the first section. The pocket is in fluid communication with the main cavity. When a vacuum is created in the main cavity, the pressure is also reduced in the pocket. As a result, the second section of the cover is deformed by the vacuum in the pocket. However, the vacuum in the pocket helps to prevent the first section from deforming, providing better support for the critical element.

16 Claims, 2 Drawing Sheets

DEFORMATION REDUCTION AT THE MAIN CHAMBER

BACKGROUND OF THE INVENTION

The present invention relates to vacuum chambers. More particularly, the present invention relates to an improved vacuum chamber in a plasma processing device.

Vacuum chambers may be used in manufacturing. Vacuum chambers may be used for plasma processing.

To facilitate discussion, FIG. 1 is a schematic view of a prior art vacuum chamber 10 used in a plasma processing process. The vacuum chamber 10 may have a chamber wall 12, a bottom 14, a cover 16 and at least one exhaust port 18 to remove gas from the vacuum chamber to maintain a vacuum. The cover 16 may be mounted on the chamber wall 12 with a seal 22 between the cover 16 and the chamber wall 12 to help maintain the vacuum. The cover 16 may be supported around the edge of the cover with no support in the middle. In a plasma processing device that capacitively establishes a plasma, a lower electrode 24 may be supported by the bottom 14, and an upper electrode 26 may be supported by the cover. Such plasma processing devices may require a uniform spacing between the upper electrode 26 and the lower electrode 24. The vacuum load may cause the cover 16 to deform, as indicated by dashed lines 28 in FIG. 1. Since the upper electrode 26 is supported by the cover 16, the deformation of the cover 16 may cause the upper electrode 26 to deform, as indicated by dashed line 30. The deformation of the upper electrode 26 may cause the spacing between the upper electrode 26 and the lower electrode 24 to not be uniform. If the upper electrode 26 or some other critical element fastened to more than one point on the cover is brittle, the deformation may crack the upper electrode or other critical element. A critical element is defined as a device such as the upper electrode or an antenna, supported by the cover 16, which is affected by the deformation of the cover.

As larger wafers are being processed in plasma devices using vacuum chambers, larger vacuum chambers are required. Wider diameters of the larger covers may cause the larger covers to be more susceptible to deformation under a vacuum load.

To avoid deformation, the covers may be made thicker, which makes the covers heavier and more expensive.

In view of the foregoing, it is desirable to have a vacuum chamber cover that remains flat in vacuum conditions.

SUMMARY OF THE INVENTION

To achieve the foregoing and other objects and in accordance with the purpose of the present invention, a vacuum chamber cover is provided. A vacuum chamber wall defines a main cavity and an opening. An exhaust port is in fluid connection with the central cavity to establish a vacuum in the main cavity. A cover for sealing the opening when the cover is supported by the chamber wall is provided. The cover is formed by a first section adjacent to the main cavity. A second section of the cover is placed on a side of the first section that is opposite the main cavity. A pocket is placed between the first section and the second section.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
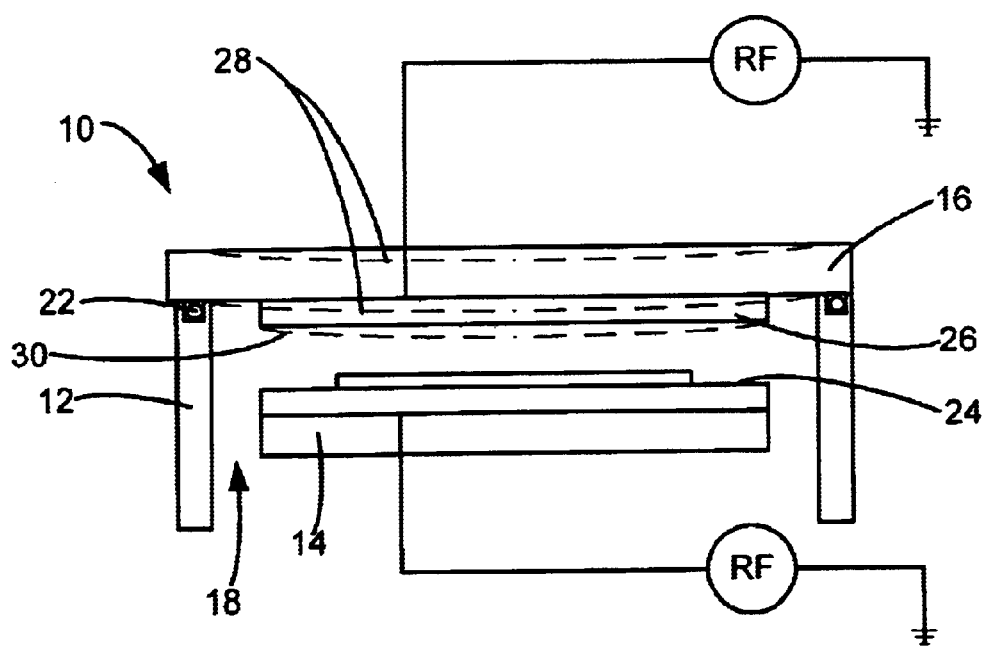
FIG. 1 is a schematic view of a prior art vacuum chamber used in a plasma processing process.
Figure 2:
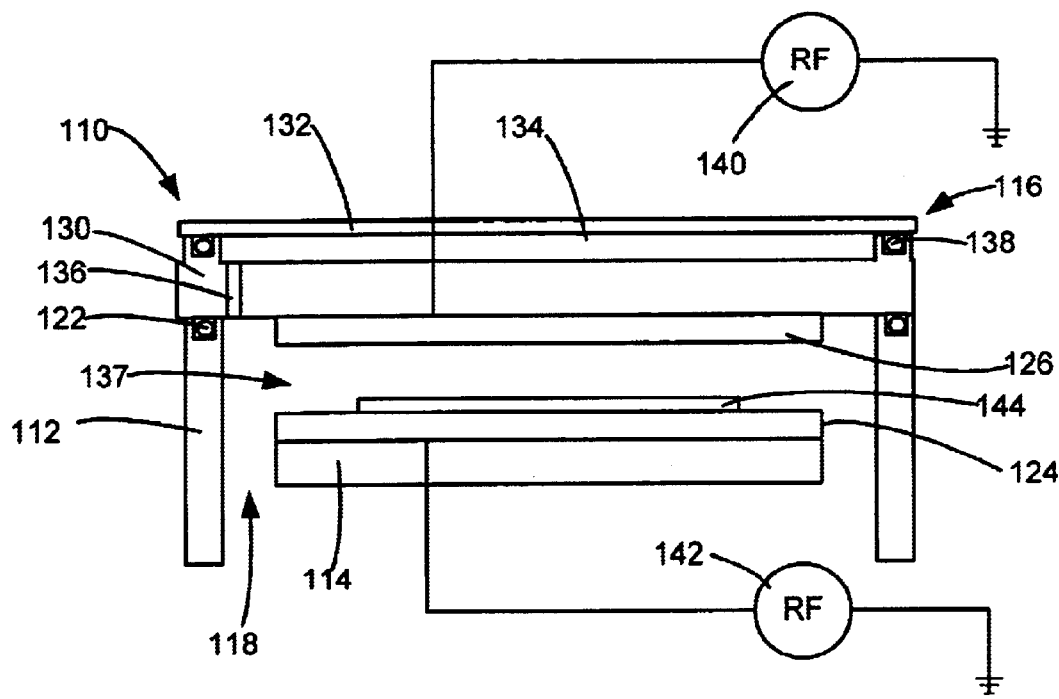
FIG. 2 is a schematic view of a vacuum chamber according to one embodiment of the invention.

To facilitate discussion, FIG. 2 is a schematic view of a vacuum chamber 110 according to one embodiment of the invention. The vacuum chamber 110 may have a chamber wall 112, a bottom 114, a cover 116 and at least one exhaust port 118 to remove gas from the vacuum chamber to maintain a vacuum. The chamber wall 112 defines an opening. The cover 116 extends across the opening. The cover 116 may be mounted on the chamber wall 112 with a seal 122 between the cover 116 and the chamber wall 112 to help maintain the vacuum. The cover 116 may be supported around the edge of the cover with no support in the middle. In a plasma processing device that capacitively establishes a plasma, a lower electrode 124 may be supported by the bottom 114, and an upper electrode 126 may be supported by the cover 116. In the preferred embodiment of the invention, the cover 116 comprises a first section 130 and a second section 132. The upper electrode 126 is supported by the first section 130 of the cover 116. In this embodiment, the seal 122 is established between the chamber wall 112 and the first section 130 of the cover 116. A pocket 134 is placed between the first section 130 and the second section 132 of the cover 116, so that most of the first section 130 is spaced apart from most of the second section 132 by the pocket 134 and so that the first section 130 contacts the second section 132 only near where the chamber wall 112 supports the cover 116. A channel 136 extends through the first section 130 of the cover 116 to provide fluid communication between the main cavity 137 of the vacuum chamber 110 and the pocket 134. In this embodiment, a vacuum tight seal 138 is established between the first section 130 and the second section 132 of the cover 116 to allow a vacuum to be maintained in the pocket 134. A first radio frequency power source 140 is electrically connected to the upper electrode 126. A second radio frequency power source 142 is electrically connected to the lower electrode 124.

Figure 3:
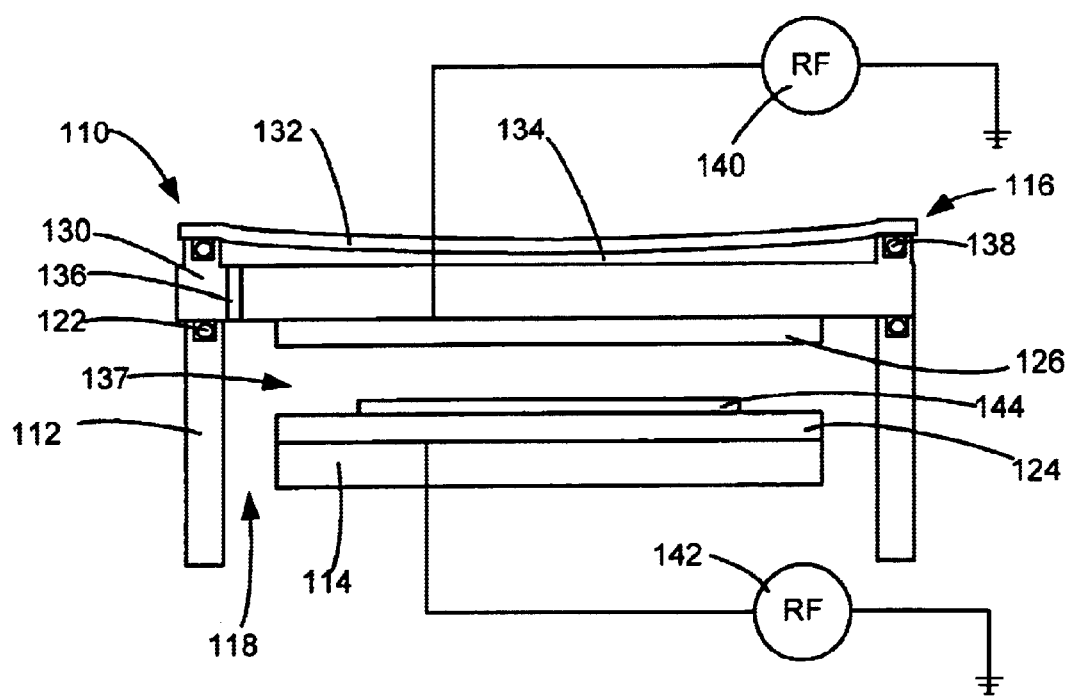
FIG. 3 is a schematic view of the vacuum chamber illustrated in FIG. 2 when a vacuum is in the vacuum chamber.

In operation, a substrate 144 is placed over the lower electrode 124. Gas is expelled through the exhaust port 118 to create a vacuum in the main cavity 137 of the vacuum chamber 110. Since the pocket 134 of the cover 116 is in fluid communication with the main cavity 137 of the vacuum chamber 110, a vacuum is created in the pocket 134. The vacuum in the pocket 134 causes the second section 132 of the cover 116 to deform, as illustrated in FIG. 3. The second section 132 is thick enough to not burst under a vacuum and preferably to not deform so much that the second section 132 contacts and pushes against the center of the first section 130 of the cover. Since the second section 132 is able to deform, the second section 132 may be thin. Since the pocket 134 maintains a vacuum that is comparable to the vacuum in the main cavity 137 of the vacuum chamber 110, the first section 130 may be thin, since deformation of the first section 130 of the cover due to the vacuum is only caused by the difference in pressure between the main cavity 137 and the pocket 134. If the pocket 134 has the exact pressure as the main cavity 137, then the vacuum should not provide any deformation of the first section 130 of the first section 130 only needs to be thick enough to support the weight of the first section 130 and any element supported by the first section with tolerable deformation. Therefore a relatively thin first section 130 may provide tolerable deformation. The first radio frequency power source 140 applies an alternating voltage to the upper electrode 126. The second radio frequency power source 142 applies an alternating voltage to the lower electrode 124. A plasma is ignited and capacitively energized by the alternating voltages from the upper electrode 126 and the lower electrode 124.

Since the upper electrode 126 is supported by the first section 130, the deformation of the upper electrode 126 is tolerable. In addition, the spacing between the upper electrode 126 and the lower electrode 124 may be kept sufficiently uniform. The tolerable deformation prevents the upper electrode 126 or some other critical element, such as an antenna or gas input nozzle, fastened to more than one point of the first section 130 from cracking or breaking.

The pocket may extend between the first section 130 and the second section 132 above the region where the first section 130 supports critical elements, such as the upper electrode 126. It is desirable to prevent deformation of the first section 130 at the region where the first section supports critical elements. So it would be desirable to provide the pocket above such a region. Such a pocket is established so that there is no mechanical support between the first section 130 and the second section 132 in the region above where the first section supports critical elements. If there was a mechanical support between the first section 130 and the second section 132 in this region, a deflection of the second section 132 would be transferred through the mechanical support to cause a deflection of the first section in the region where the first section is supporting the critical element. More preferably, only where the cover 116 is supported by the chamber wall 112, the first section 130 supports the second section 132, so that the pocket between the first section 130 and the second section 132 extends substantially from one side of the chamber wall 112 to the other side of the chamber wall 112, therefore substantially across the opening defined by the chamber wall 112 and closed by the cover 116, as shown in FIG. 2. By having the pocket extend substantially across the opening defined by the chamber wall 112 and closed by the cover 116 the first section 130 may undergo minimal deformation.

In another embodiment of the invention, a pressure difference may be established between the pocket 134 and the main cavity 137. One method of establishing the pressure difference is to make the channel 136 sufficiently small. Another method of establishing the pressure difference is by providing a gas input into the pocket 134. Such a gas input would increase the pressure in the pocket 134.

In such an example, the pressure in the pocket 134 may be 0.25 atmospheres. The pressure in the main cavity 137 may be approximately 0 atmospheres. In such a case, the first section 130 of the cover 116 must be sufficiently strong so that the difference between the pressure in the pocket 134 and the main cavity 137, which is 0.25 atmospheres, and force caused by gravity would only cause a tolerable deformation of the first section 130 of the cover 116.

In another embodiment of the invention, the first section of the cover and the second section of the cover may be formed from a single solid piece, which surrounds the pocket.

While this invention has been described in terns of several preferred embodiments, there are alterations, permutations, and substitute equivalents which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. An apparatus, comprising:
   a vacuum chamber wall defining a main cavity and an opening;
   an exhaust port in fluid connection with the main cavity for establishing a vacuum in the main cavity;
   a cover for sealing the opening when the cover is supported by the chamber wall, comprising:
      a first section adjacent to the main cavity, wherein the first section of the cover is supported by the chamber wall;
      a second section on a side of the first section opposite of the main cavity, wherein the second section is supported by the first section;
      a pocket between the first section and the second section;
      a vacuum tight seal between the first section and the second section; and
      a vacuum tight seal between the first section and the vacuum chamber wall; and
   a critical element supported by a region of the first section and extending into the main cavity from the first section, wherein support of the second section by the first section is not above support of the critical element by the first section, wherein the pocket extends between the first section and the second section above the region of the first section upon which the critical element is supported, so that the first section separates the critical element and the pocket.

2. The apparatus, as recited in claim 1, wherein the critical element is an electrode, and further comprising a channel extending from the main cavity to the pocket.

3. The apparatus, as recited in claim 2, further comprising a radio frequency power source electrically connected to the electrode.

4. The apparatus, as recited in claim 1, further comprising a channel extending between the pocket and the main cavity.

5. The apparatus, as recited in claim 4, wherein the pocket extends substantially across the opening.

6. The apparatus, as recited in claim 1, wherein the second section is supported by the first section only where the first section is supported by the chamber walls.

7. The apparatus, as recited in claim 6, wherein the critical element is an electrode.

8. The apparatus, as recited in claim 1, wherein the critical element is an electrode and further comprising a radio frequency power source electrically connected to the electrode.

9. The apparatus, as recited in claim 1, wherein the first section of the cover extends across the opening.

10. An apparatus, comprising:
- a vacuum chamber wall defining a main cavity and an opening;
- an exhaust port in fluid connection with the main cavity for establishing a vacuum in the main cavity;
- a cover for sealing the opening when the cover is supported by the chamber wall, comprising:
  - a first section adjacent to the main cavity, wherein the first section of the cover is supported by the chamber wall;
  - a second section on a side of the first section opposite of the main cavity, wherein the second section is supported by the first section only where the first section is supported by the chamber walls; and
  - a pocket between the first section and the second section;
  - a vacuum tight seal between the first section and the second section; and
- a critical element supported by a region of the first section and extending into the main cavity from the first section, wherein the pocket extends above the region of the first section upon which the critical element is supported, so that at least part of the first section is between the critical element and the pocket.

11. The apparatus, as recited in claim 10, wherein the critical element is an electrode.

12. The apparatus, as recited in claim 11, further comprising a radio frequency power source electrically connected to the electrode.

13. The apparatus, as recited in claim 12, further comprising a channel extending between the pocket and the main cavity.

14. The apparatus, as recited in claim 10, wherein the cover further comprises a vacuum tight seal between the first section and the vacuum chamber wall.

15. The apparatus, as recited in claim 10, wherein the first section of the cover extends across the opening.

16. The apparatus, as recited in claim 10, wherein the first section separates the critical element from the pocket.

* * * * *